(12) United States Patent
Peidous et al.

(10) Patent No.: US 7,767,540 B2
(45) Date of Patent: Aug. 3, 2010

(54) TRANSISTOR HAVING A CHANNEL WITH TENSILE STRAIN AND ORIENTED ALONG A CRYSTALLOGRAPHIC ORIENTATION WITH INCREASED CHARGE CARRIER MOBILITY

(75) Inventors: Igor Peidous, Fishkill, NY (US);
Thorsten Kammler, Ottendorf-Okrilla (DE); Andy Wei, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 504 days.

(21) Appl. No.: 11/567,268

(22) Filed: Dec. 6, 2006

(65) Prior Publication Data

US 2007/0252144 A1     Nov. 1, 2007

(30) Foreign Application Priority Data

Apr. 28, 2006    (DE)  ............... 10 2006 019 835

(51) Int. Cl.
*H01L 21/76* (2006.01)
(52) U.S. Cl. ............ 438/424; 438/187; 257/E21.135
(58) Field of Classification Search ........... 438/424, 438/187; 257/57, E21.545, E21.423, E21.135
See application file for complete search history.

(56) References Cited

U.S. PATENT DOCUMENTS

| 5,734,181 | A | 3/1998 | Ohba et al. ............... 257/77 |
| 7,220,656 | B2 * | 5/2007 | Forbes ..................... 438/457 |
| 7,485,544 | B2 * | 2/2009 | Forbes et al. ............ 438/427 |
| 2002/0063292 | A1 | 5/2002 | Armstrong et al. ........ 257/367 |
| 2004/0217448 | A1 | 11/2004 | Kumagai et al. ........... 257/627 |
| 2005/0035409 | A1 | 2/2005 | Ko et al. .................. 257/350 |
| 2005/0082616 | A1 | 4/2005 | Chen et al. ............... 257/350 |
| 2005/0093075 | A1 | 5/2005 | Bentum et al. ............ 257/368 |
| 2005/0093105 | A1 | 5/2005 | Yang et al. ............... 257/627 |
| 2005/0116360 | A1 | 6/2005 | Huang et al. ............. 257/900 |
| 2006/0024876 | A1 | 2/2006 | Chidambaram et al. .... 438/198 |
| 2006/0043424 | A1 | 3/2006 | Bowen et al. ............. 257/204 |
| 2006/0049430 | A1 | 3/2006 | Kasai et al. .............. 257/213 |

OTHER PUBLICATIONS

PCT Search Report Dated Aug. 24, 2007 for Serial No. PCT/US07/007843.
"Mobility Improvement for 45nm Node by Combination of Optimized Stress Control and Channel Orientation Design," by Komoda, et al; 2004.
Ang et al., "Enhanced Performance in 50 nm N-MOSFETs with Silicon-Carbon Source/Drain Register," *IEDM Technical Digest*, pp. 1069-1071, Dec. 2004.
Written Opinion from Singapore Application No. 0807674-7 dated Sep. 23, 2009.

\* cited by examiner

*Primary Examiner*—Roy K Potter
(74) *Attorney, Agent, or Firm*—Williams, Morgan & Amerson, P.C.

(57) ABSTRACT

By appropriately orienting the channel length direction with respect to the crystallographic characteristics of the silicon layer, the stress-inducing effects of strained silicon/carbon material may be significantly enhanced compared to conventional techniques. In one illustrative embodiment, the channel may be oriented along the <100> direction for a (100) surface orientation, thereby providing an electron mobility increase of approximately a factor of four.

11 Claims, 4 Drawing Sheets

TRANSISTOR HAVING A CHANNEL WITH TENSILE STRAIN AND ORIENTED ALONG A CRYSTALLOGRAPHIC ORIENTATION WITH INCREASED CHARGE CARRIER MOBILITY

BACKGROUND OF THE INVENTION

1. Field of the Invention

Generally, the present invention relates to the formation of integrated circuits, and, more particularly, to the formation of transistors having strained channel regions by using strain-inducing sources, such as an embedded strained layer, in the drain and source regions to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the new development of highly complex process techniques, for example, for compensating for short channel effects, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, compressive strain in the channel region may increase the mobility of holes, thereby providing the potential for enhancing the performance of P-type transistors. On the other hand, the creation of tensile strain in the channel region of an N-channel transistor may increase electron mobility. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create strain in the adjacent silicon channel region. To this end, the drain and source extension regions of the PMOS transistors are formed on the basis of ion implantation. Thereafter, respective sidewall spacers are formed at the gate electrode as required for the definition of the deep drain and source junctions and the metal silicide in a later manufacturing stage. Prior to the formation of the deep drain and source junctions, these regions are selectively recessed based on the sidewall spacers, while the NMOS transistors are masked. Subsequently, a highly in situ doped silicon/germanium layer is selectively formed in the PMOS transistor by epitaxial growth techniques. Since the natural lattice spacing of silicon/germanium is greater than that of silicon, the epitaxially grown silicon/germanium layer, adopting the lattice spacing of the silicon, is grown under compressive strain, which is efficiently transferred to the channel region, thereby compressively straining the silicon therein. This integration scenario results in a significant performance gain of the P-channel transistors. Hence, a similar concept has been proposed for N-channel transistors by using a silicon/carbon material that has a smaller lattice spacing compared to silicon. The resulting gain in performance, however, is less pronounced than expected. Since the further device scaling may involve further performance reducing mechanisms for countering short channel effects, such as increased dopant levels in the channel region, high-k dielectrics in the gate insulation layer and the like, it is, however, of high importance to provide efficient techniques for compensating or over-compensating for such mobility-degrading approaches by efficiently increasing the charge carrier mobility for N-channel transistors by using strain-inducing mechanisms, such as strained silicon/carbon material and the like.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that may provide efficiently enhanced charge carrier mobility by taking into consideration for the strain-inducing mechanism, the crystallographic differences of a silicon-based semiconductor material in view of their characteristics of charge carrier mobility. In illustrative embodiments, certain stress sources, such as strained silicon/carbon material, may provide a substantially tensile strain in the respective channel region along the channel length direction, whereas a significant amount of compressive strain may be generated in the transistor width direction, which may unduly reduce the performance gain for N-channel transistors having the conventional crystallographic orientation of the channel region. By appropriately assessing the strain-inducing mechanism in combination with the crystalline characteristics, the channel regions may be appropriately oriented in order to obtain a more pronounced mobility increase. In one illustrative embodiment, this technique may be efficiently applied to embedded silicon/carbon regions in drain and source regions of N-channel field effect transistors, wherein a corresponding adjustment of the channel orientation with respect to the crystallographic orientation of the base silicon material may provide mobility increase caused by the tensile strain along the transistor length direction and by a respective compressive strain acting along the width direction. Consequently, a plurality of efficient techniques for the formation of embedded silicon/carbon areas adjacent to the channel region of N-channel transistors may be significantly "amplified" with respect to their effect on increasing electron mobility.

According to one illustrative embodiment of the present invention, a semiconductor device comprises a first transistor having a first channel region defining a first channel length direction, wherein the channel region comprises a crystalline silicon material with a tensile strain component oriented along the first channel length direction. Moreover, the first channel length direction is oriented substantially along a crystallographic <100> direction.

According to another illustrative embodiment of the present invention, a method comprises selecting a first orientation of a channel length direction of a channel region with tensile strain for an N-channel transistor to be formed in a silicon-based semiconductor layer, wherein the semiconductor layer has a specified surface orientation and wherein the first orientation is selected on the basis of at least two linearly independent strain components in the channel region. The method further comprises forming drain and source regions of the first transistor to define the channel region, wherein the channel length direction is substantially oriented along the first orientation. Furthermore, a tensile strain is induced in the channel region along the first channel length direction.

According to yet another illustrative embodiment, a method comprises forming a strained silicon/carbon material near a channel region of a transistor wherein the channel region defines a length direction substantially along a <100> crystallographic orientation of a silicon-based layer.

BRIEF DESCRIPTION OF THE DRAWINGS

The invention may be understood by reference to the following description taken in conjunction with the accompanying drawings, in which like reference numerals identify like elements, and in which.

Figure 1A:
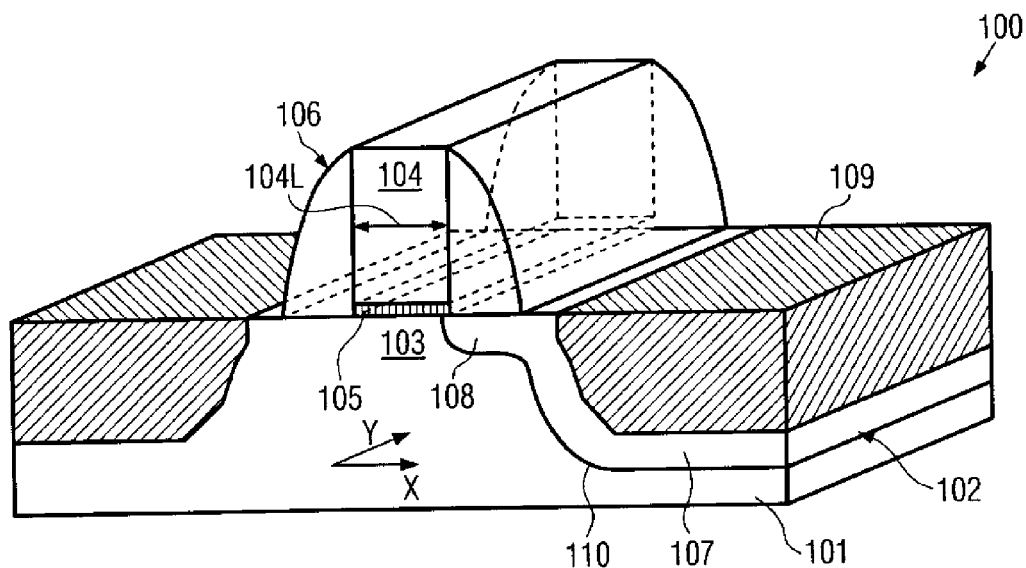
FIG. 1a schematically illustrates a perspective view of an N-channel transistor comprising a strained silicon/carbon material embedded into drain and source regions in the vicinity of a channel region having a channel length direction oriented along a specified crystallographic orientation according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for more efficiently enhancing the charge carrier mobility in N-channel transistors by appropriately selecting the channel length direction in accordance with crystallographic specifics of the silicon-based semiconductor material. As previously explained, the formation of embedded silicon/carbon material is considered a promising technique for enhancing the performance of N-channel transistors according to similar integration schemes as are successfully used for P-channel transistors, in which strained silicon/germanium material may be embedded into the drain and source regions, thereby significantly increasing the hole mobility in the respective channel region. In practice, however, the performance of conventional N-channel transistors including embedded silicon/carbon material in the drain and source regions may exhibit a performance gain that is significantly less than expected and as may be required for future technology nodes. Without intending to restrict the present invention to the following explanation, it is believed that the less effective gain in performance of conventional N-channel transistors with embedded silicon/carbon material may be attributed to two-dimensional strain effects in the corresponding channel. The embedded silicon/carbon material, which has a natural lattice constant less than crystalline silicon material, is formed on a silicon template, thereby receiving a certain degree of biaxial strain, i.e., a two-dimensional tensile strain, which acts as a corresponding stress source for the adjacent channel region. Consequently, the silicon material in the channel region may experience stress forces, which may, however, result in a substantially tensile strain along the channel length direction, while, on the other hand, a certain degree of compressive strain is induced along the channel width direction. As a result, the overall modification of the charge carrier mobility, i.e., the electron mobility in the channel region, may be considered as a superposition of two different types of strain, wherein, in conventional approaches, typically the channel is oriented along the crystalline <110> crystallographic orientation for a conventional semiconductor layer having a {100} surface orientation. A corresponding conventional design of an N-channel transistor may, however, significantly reduce the mobility increase since the different types of strain may at least partially cancel out each other's effect on the carrier mobility, thereby resulting in the situation as presently encountered with conventional transistor elements having strained embedded silicon/carbon regions.

Consequently, according to the present invention, the orientation of the channel length direction is selected under consideration of the two-dimensional effects of a strain-inducing mechanism in order to significantly reduce any adverse influences on the electron mobility or even provide appropriate orientation of the transistor element in order to obtain a synergetic effect of the different strain components.

With respect to FIGS. 1a-1f and 2a-2b, further illustrative embodiments of the present invention will now be described in more detail, thereby also providing an efficient technique for determining the two-dimensional strain distribution in a channel region.

FIG. 1a schematically illustrates a perspective view of an exemplary N-channel transistor 100, which may be considered as a typical transistor element having an embedded silicon/carbon material and which will also be used for describing any insufficiencies of conventional transistor elements when using embedded strained silicon/carbon for enhancing the drive current capability of the transistor 100. The device 100 may comprise an appropriate substrate 101, which, in illustrative embodiments, may represent a bulk silicon substrate having formed in an upper portion thereon a substantially crystalline silicon-based layer 102, wherein a silicon-based semiconductor material is to be understood as a semiconductor including a significant amount of silicon, such as approximately 50 atomic percent or more silicon, wherein other non-silicon materials, such as dopant species and the like, may also be present in the layer 102. In other illustrative embodiments, the substrate 101 may represent, in combination with the semiconductor layer 102, a silicon-on-insulator (SOI) configuration, wherein a buried insulating layer (not shown) may be provided between the substrate 101 and the semiconductor layer 102.

Furthermore, the device 100 may comprise a gate electrode 104, which may be comprised, in this manufacturing stage, of a highly doped polysilicon material which may be formed on a gate insulation layer 105 comprised of silicon dioxide, silicon nitride, high-k dielectric material, combinations thereof and the like. For example, in advanced applications, the gate insulation layer 105 may be formed of silicon dioxide with a thickness of one nm or less to several nm, depending on a length of the gate electrode, indicated as 104L. For example, the gate lengths 104L may be 100 nm and significantly less, for instance 50 nm and even less, for highly sophisticated devices. Typically, the reduction of the channel length 104L may require a corresponding reduction of the thickness of the gate insulation layer 105 in order to provide a high degree of controllability of a channel region 103 formed in the semiconductor layer 102 below gate insulation layer 105. However, for channel lengths below 50 nm, the reduction of the gate insulation layer 105, when formed of the well-established silicon dioxide material, may no longer be scaled down so as to provide the required channel controllability. Consequently, several approaches are proposed as countermeasures for short channel effects, such as increased doping of the channel region 103 and/or using high-k dielectric materials for the gate insulation layer 105 and the like, which may, however, have a negative impact on the mobility of the charge carriers in the channel region 103. For this reason and for reasons as explained above, a further increase of the charge carrier mobility in the channel region 103 is highly desirable, wherein the provision of strained silicon/carbon material is an extremely promising approach.

The device 100 may further comprise, depending on process strategies, a respective sidewall spacer structure 106, comprising, for instance, silicon dioxide, silicon nitride and the like. Furthermore, deep drain and source regions 107, and connected thereto respective extension regions 108, may be defined in the semiconductor layer 102 adjacent to the gate electrode 104 and the channel region 103. The vertical and lateral dopant profile of the regions 108 and 107 may be adapted in accordance with device requirements, wherein, typically, the extension regions 108 may have a shallow position and an appropriate dopant profile so as to also assist in reducing short channel effects. Moreover, a strained silicon/carbon material 109 may be formed within the semiconductor layer 102 in the vicinity of the channel region 103, wherein, in the embodiment shown, the material 109 is substantially located within the drain and source regions 107 without extending into the channel region 103 so that corresponding PN junctions 110 are substantially formed within silicon material. As will be explained with reference to FIG. 1b in more detail, the channel length direction, i.e., the direction corresponding to the channel length 104L, also indicated as X-direction in FIG. 1a, is selected with respect to the crystallographic characteristics of the semiconductor layer 102 to provide enhanced charge carrier mobility, due to a strain in the channel region 103 which may be produced by the strained silicon/carbon material 109. In one illustrative embodiment, the X-direction is substantially oriented along a <100> crystallographic direction, wherein, in this embodiment, the semiconductor layer 102 may have a surface orientation of (100). For such a configuration of the crystalline layer 102, the channel width direction, indicated as Y-direction in FIG. 1a, also corresponds to a crystallographic <100> direction.

The semiconductor device 100 as shown in FIG. 1a may be formed in accordance with the following processes. After the provision of the substrate 101, which may have formed thereon the semiconductor layer 102, or after forming the semiconductor layer 102 on the substrate 101 on the basis of epitaxial growth techniques, the design of a respective integrated circuit comprising the transistor 100 may be selected so as to correspond to the desired orientation of the channel region 103. That is, prior to actually performing any manufacturing processes, the crystallographic characteristics of the layer 102 may be determined with respect to creating tensile strain along the X-direction and by considering the two-dimensional effects of a corresponding strain-inducing mechanism.

Figure 1B:
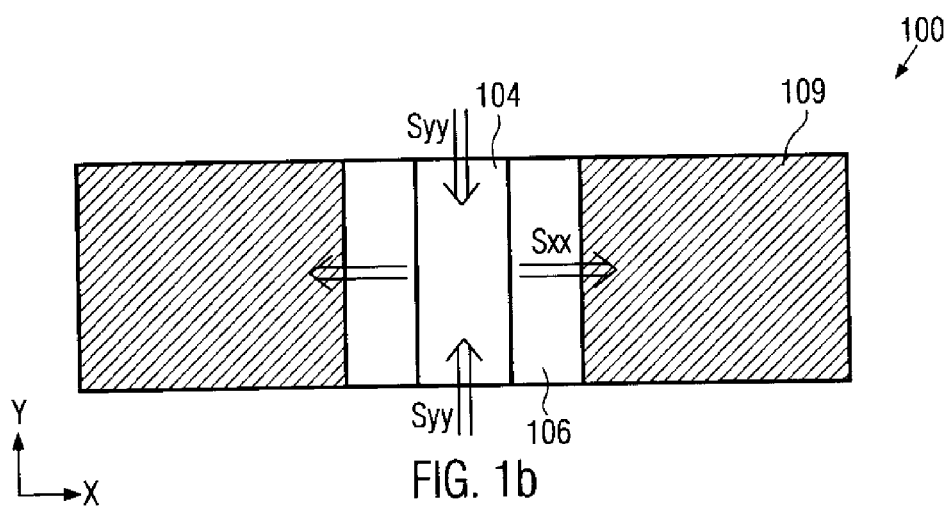
FIG. 1b schematically illustrates a top view of the device of FIG. 1a, thereby demonstrating the occurrence of a uniaxial tensile strain and a uniaxial compressive strain in the channel region.

The corresponding FIG. 1b schematically illustrates a corresponding design or an actual plan view of the device 100, wherein a situation is indicated when the strained silicon/carbon material 109 acts on the channel region 103. As shown, the embedded silicon/carbon material 109 may create a longitudinal tensile stress, indicated as Sxx in FIG. 1b, in the channel region 103, i.e., the region located below the gate electrode 104. The corresponding longitudinal tensile stress Sxx may then be the source of a corresponding tensile strain, which may have a respective effect on the charge carrier mobility in the channel region 103. At the same time, the strained silicon/carbon material 109 may produce a transverse stress component, i.e., a stress component Syy acting along the channel width direction, i.e., the Y-direction, wherein the corresponding stress component is compressive. That is, since the area along the transistor width direction available for stress interaction is significantly greater compared to the respective area available in the transistor length direction, the corresponding strain of the regions 109, which may be understood as a substantially biaxial strain, acts more intensively along the length of the channel region 103 to provide the tensile stress and strain Sxx, thereby also creating a respective compressive stress in the silicon material along the width direction of the channel 103. In other words, the natural contraction of the regions 109 entails a "pulling" effect on the channel 103 along the channel length and a "contraction" effect in the transverse direction to the channel length. Consequently, the corresponding tensile component Sxx and the compressive component Syy are produced in the channel region 103. According to respective stress calculations, the magnitude of Syy depends on the transistor width and may, in many cases, range from approximately 0.3 Sxx to 1.3 Sxx. The combined effect of the stress components Sxx and Syy on the electron mobility may be estimated by using piezoelectric coefficients for silicon. For example, for a typical conventionally designed MOSFET transistor, i.e., for a MOSFET transistor formed on a silicon layer having a (100) surface orientation, the devices are typically oriented along the crystallographic directions <110>. For this conventional orientation, the respective piezoelectric coefficients may yield:

$$\nabla\mu/\mu = 0.31 Sxx + 0.18 Syy \quad (1)$$

wherein the relative modification of the electron mobility $\nabla\mu/\mu$ is obtained for the above-specified coefficients, when the respective stress components are expressed in units of GPa. From the above Equation 1, it is evident that the longitudinal tensile (positive) stress component Sxx enhances the electron mobility in the channel region 103 with a factor of 0.31. However, the transverse compressive (negative) stress component Syy has a coefficient of 0.18 and, due to the negative sign, the stress component Syy decreases the electron mobility. Consequently, in the conventional configuration, the combined stress effect on the electron mobility is significantly compensated for, or may, for certain device configurations, that is, for reduced transistor width, even become negative. As a result, based on presently established selective epitaxial growth techniques for silicon/carbon, providing a moderately low carbon doping within the epitaxially grown silicon material, a relatively insignificant performance gain or even a decreased drive current capability may be obtained. According to the present invention, the same analysis based on the piezoelectric coefficients and two-dimensional stress calculations reveals that, if the layer 102 has crystallographic orientation of its surface (100) and transistor channel length is orientated in the layer 102 along a crystallographic direction [100], then the longitudinal stress component Sxx and the compressive stress component Syy may have the following effect on the electron mobility:

$$\nabla\mu/\mu = 1.02 Sxx - 0.53 Syy \quad (2)$$

That is, the relative increase of electron mobility $\nabla\mu/\mu$ with respect to the tensile stress component may be associated with the coefficient of 1.02, while the transverse compressive, that is, negative, stress component Syy is associated with the negative coefficient of 0.53. As a consequence, both stress components Sxx and Syy may positively contribute to a mobility increase, thereby significantly increasing the overall performance, irrespective of the transistor configuration with respect to transistor length and transistor width.

Again referring to FIG. 1a, based on the above considerations, the substrate 101 having formed thereon the semiconductor layer 102 may be appropriately positioned during the manufacturing sequence in order to obtain an orientation of the channel region 103 that provides a desired increase of electron mobility. For example, in the above-specified case, the orientation of the channel length direction X may be selected so as to obtain a maximum mobility increase of electrons for the channel region 103. It should be appreciated, however, that other X-orientations may be selected with respect to the crystallographic characteristics, depending on requirements for other circuit elements, such as P-channel transistors and the like. For instance, the respective two-dimensional strain calculations may be performed for a plurality of different orientations in order to obtain a desired mobility increasing orientation for any type of transistors to be formed above the substrate 101, substantially without requiring different orientations for different transistor types. In other illustrative embodiments, the X-orientation of all or at least a significant portion of transistors of the type of the device 100 may be selected on the basis of the above two-dimensional calculations, while other transistor elements may be oriented in a different direction.

Next, corresponding manufacturing processes may be performed to define the respective silicon-based regions within the semiconductor layer 102 on the basis of corresponding isolation structures (not shown), such as trench isolations and the like, on the basis of well-established photolithography, etch, deposition and planarization techniques. Thereafter, corresponding implantation processes may be carried out in order to provide the required dopant concentration in the respectively defined silicon regions on the basis of well-established techniques. For example, respective threshold voltage implantation processes and the like may be performed. Next, appropriate materials for the gate insulation layer 105 and the gate electrode 104 may be formed by oxidation and/or deposition and may be subsequently patterned on the basis of advanced photolithography and etch techniques, wherein, for forming the strained silicon/carbon material 109 in a later stage, a corresponding capping layer may also be provided on top of the gate electrode 104. Depending on the process strategy, appropriate spacer structures (not shown) may be formed for encapsulating the gate electrode 104 and a respective etch process may be carried out in order to form appropriately shaped recesses in the layer 102, which may subsequently be filled with the strained silicon/carbon material 109 on the basis of selective epitaxial growth techniques. It should be appreciated that a plurality of different process strategies may be followed when forming the material 109, wherein the size and shape of the material 109, as well as its offset from the channel region 103 and the like, may represent respective device parameters for correspondingly selecting and controlling the respective manufacturing processes.

For example, in the embodiment shown, the silicon/carbon material 109 is formed with a moderately high offset to the channel region 103, thereby positioning the silicon/carbon material 109 completely within the drain and source regions 107, while, in other embodiments, the material 109 may be positioned in close proximity to the channel region 103 in order to enhance the stress transfer mechanism. It should further be appreciated that prior to, after or intermittently a respective process sequence may be performed in other device areas to form a selectively grown silicon/germanium material in order to enhance the performance of P-channel transistors. Moreover, in some illustrative embodiments, the selective epitaxial growth process for forming the material 109 may be designed to provide an in situ doped material, thereby providing the possibility of reducing implantation processes for forming the regions 108 and 107 in order to reduce implantation-induced damage in the strained material 109. For instance, the extension region 108 may have been formed prior to the selective growth of the material 109. After the selective epitaxial growth of the material 109, a correspondingly designed anneal process may be performed to diffuse the dopants from the silicon/carbon material 109 into the layer 102 in order to form the deep drain and source regions 107. In other illustrative embodiments, the deep drain and source regions 107, as well as the extensions 108, may be formed on the basis of implantation processes, which may be performed after the formation of the material 109 or which may be formed prior to the selective growth of the material 109. To this end, the spacer structure 106 may be formed with appropriate dimensions so as to act as an efficient implantation mask, for instance for the formation of the deep drain and source regions 107 on the basis of well-established implantation techniques. Thereafter, the further processing of the device 100 may be continued by, for instance, forming metal silicide regions in the gate electrode 104 and the drain and source regions 107 on the basis of the spacer structure 106 according to any appropriate silicidation technique, during which an appropriate refractory metal, such as nickel, platinum, cobalt, or combinations thereof, may be converted into a highly conductive metal silicide.

Consequently, after the completion of the device 100, the channel region 103 may experience a tensile strain in the X-direction, which may be oriented along a crystallographic orientation resulting in a significantly increased electron mobility, while, on the other hand, the respective compressive stress along the Y-direction may not significantly reduce the electron mobility or may even significantly enhance mobility, as is for instance explained with reference to Equation 2.

Figure 1C:
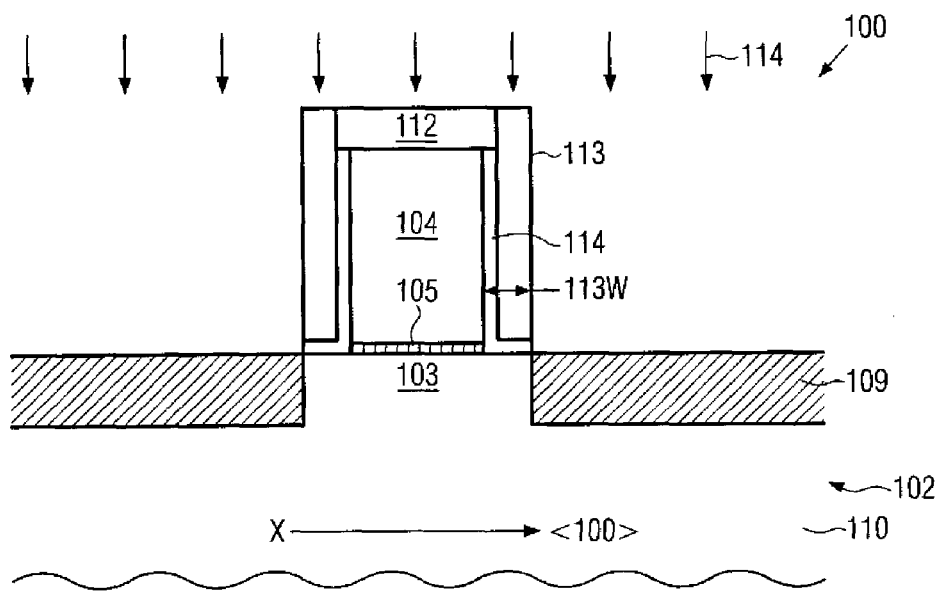
FIGS. 1c-1g schematically illustrate cross-sectional views of an N-channel transistor during the provision of respective strain-inducing sources, wherein the channel length direction is oriented according to a specified crystallographic orientation selected in accordance with illustrative embodiments of the present invention.

FIG. 1c schematically illustrates a transistor 100 in accordance with further illustrative embodiments, in which strained silicon/carbon material is positioned very close to the channel region 103, thereby even more efficiently creating tensile and compressive strain in the channel region 103. In the manufacturing stage as shown in FIG. 1c, the transistor 100 may comprise a capping layer 112, for instance comprised of silicon nitride, which is formed on top of the gate electrode 104. Moreover, a sidewall spacer 113, for instance comprised of silicon nitride or any other appropriate material, may be formed at sidewalls of the gate electrode 104, wherein, if required, an appropriate liner 111, such as a silicon dioxide liner, may be formed between the gate electrode 104 and the spacer 113. A width of the spacer 113, indicated as 113W, may be selected according to device-specific requirements so as to position the strained silicon/carbon material more closely to the channel region 103. For this purpose, the transistor 100 may be exposed to an appropriately designed selective etch process, during which the capping layer 112 and the spacer 113 may reliably protect the gate electrode 104, while, in other device regions, an appropriate capping layer may be provided, when a respective cavity etch process may not be desired in these device areas. Moreover, the degree of anisotropy of the corresponding etch process may be selected on the basis of device requirements, wherein, for a moderately short spacer width 113W in the range of approximately 5 nm or even significantly less, a substantially anisotropic characteristic of the etch process may be selected in order to avoid undue etch damage in the vicinity of the gate insulation layer 105. In some illustrative embodiments, prior to the selective etch process, the extension regions 108 may have been formed on the basis of an appropriately designed offset spacer (not shown) or even on the basis of the spacer 113. Next, a selective epitaxial growth process 114 may be performed in order to grow the material 109, wherein, as previously explained, the material 109 may be provided with a high dopant concentration or may be provided as a substantially intrinsic silicon/carbon material, if the deep drain and source regions are formed on the basis of implantation processes.

Figure 1D:
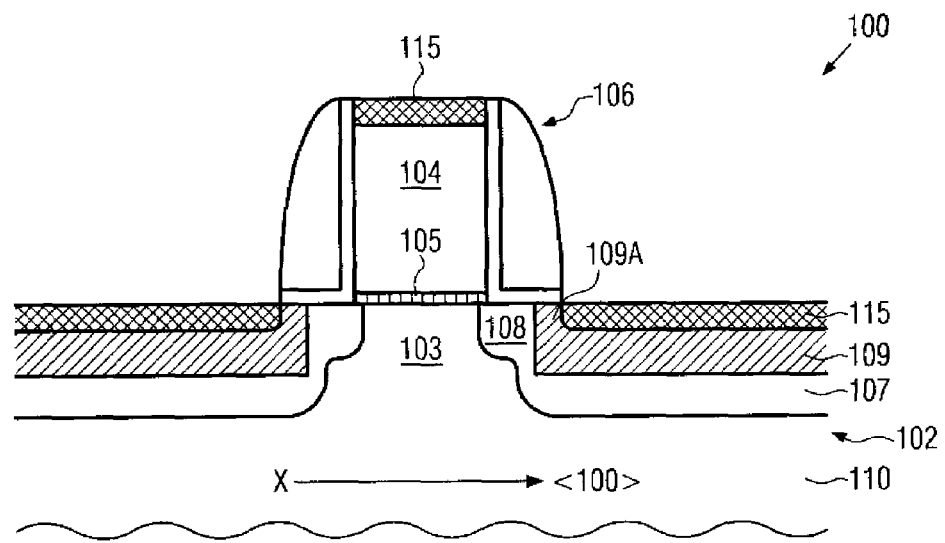

FIG. 1d schematically illustrates the device 100 of FIG. 1c in a further advanced manufacturing stage, in which the deep drain and source regions 107, as well as the extension regions 108 and the sidewall spacer structure 106, are formed, wherein, in the embodiment shown, the deep drain and source regions 107 may be formed by diffusion on the basis of a high dopant concentration in the material 109, thereby avoiding or at least significantly reducing implantation-induced damage in the material 109. Moreover, respective metal silicide regions 115 may be formed in the material 109 and the gate electrode 104 on the basis of the spacers 106. As a consequence, strained silicon/carbon material, indicated as 109A, may be located in close proximity to the channel region 103, thereby providing a high stress transfer mechanism. Moreover, when the extension region 108 has been formed prior to the selective epitaxial growth process 114, and the deep drain and source regions 107 may have been formed on the basis of diffusion, the material portion 109A may be provided with a significantly reduced defect rate, thereby maintaining a high degree of tensile strain therein. Thus, any strain relaxation that may be caused by the metal silicide regions 115 has a less pronounced effect on the overall stress-inducing mechanism. As a consequence, the transistor 100 as shown in FIG. 1d, comprises a highly efficient strain-inducing mechanism, wherein the channel length direction, i.e., the X-direction, may be oriented along a crystallographic orientation providing a high positive effect on the electron mobility in the region

103. In the embodiment shown, the X-direction may be oriented along the <100> direction, wherein for a (100) surface orientation of the layer 102, the channel width is also oriented along a <100> direction, thereby providing the highly efficient mobility increasing mechanism as described with reference to Equation 2.

Figure 1E:
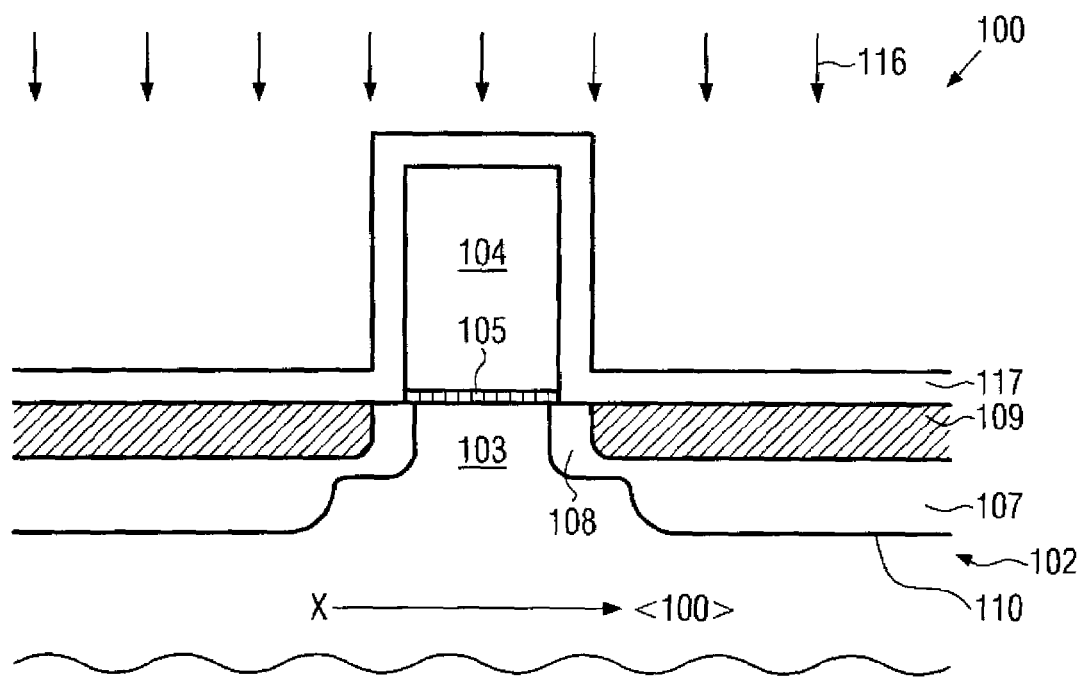

FIG. 1e schematically illustrates the transistor 100 according to further illustrative embodiments, in which a different process strategy for forming the strained silicon/carbon material 109 is applied. In this embodiment, the transistor 100 may comprise the deep drain and source regions 107 and extension regions 108, while, in other embodiments, these regions may still have to be formed on the basis of appropriate implantation techniques. Moreover, in one illustrative embodiment, the device 100 may have experienced an appropriate anneal process, so that the dopants in the regions 108 and 107 may have been diffused to their intended positions within the layer 102 in order to define the PN junctions 110 having an appropriate profile. Similarly, transistor elements in other device regions, such as P-channel transistors and the like, or any other transistors, may be in a very advanced manufacturing stage comparable to the configuration as shown in FIG. 1e. In this stage, an appropriate process sequence 116 may be performed in order to incorporate a desired degree of carbon concentration into the drain and source regions 107 by implantation. In one illustrative embodiment, the process sequence 116 may comprise an amorphization implantation, for instance on the basis of silicon, in order to provide a substantially amorphized portion within the drain and source regions 107, wherein a desired offset of the respective amorphized portion with respect to the gate electrode 104 may be established on the basis of an appropriately designed liner material 117, for instance comprised of silicon dioxide. For example, the liner 117 may have been formed in combination with an appropriate spacer structure, such as the spacers 106, on the basis of which the deep drain and source regions 107 may have been formed by ion implantation. Thereafter, the corresponding spacers may have been removed, for instance on the basis of highly selective wet or dry chemical etch processes and the corresponding amorphization implantation may be performed. If a corresponding amorphization of other device areas may not be desired, a corresponding implantation mask, such as a resist mask, may be readily formed on the basis of well-established techniques.

Next, an appropriately configured implantation process may be performed to introduce a desired concentration of carbon atoms into the substantially amorphized portion wherein, for instance, an implantation dose of approximately $5 \times 10^{15}$-$5 \times 10^{16}$ ions/cm$^2$ may be appropriate for incorporating a concentration of 1.5-4.0 atomic percent carbon. After the implantation, the substantially amorphized portion including the moderately high carbon concentration may be re-crystallized on the basis of advanced anneal techniques, which may comprise laser-based or flash-based anneal methods. During the flash-based or laser-based anneal process, a pulsed radiation may be directed onto the device 100, thereby depositing sufficient energy for initiating the re-crystallization and effecting activation of the carbon atoms, while substantially suppressing or avoiding the out-diffusion of dopant species of the extension regions 108 and the deep drain and source regions 107 and of dopants in other devices, thereby substantially maintaining the profile of the PN junctions 110. Furthermore, the additional anneal process may enhance the activation of the dopants in the drain and source regions 107 and the extensions 108 in the transistor 100 and also in other transistor elements provided in other device regions, which may have not received the carbon implantation.

Figure 1F:
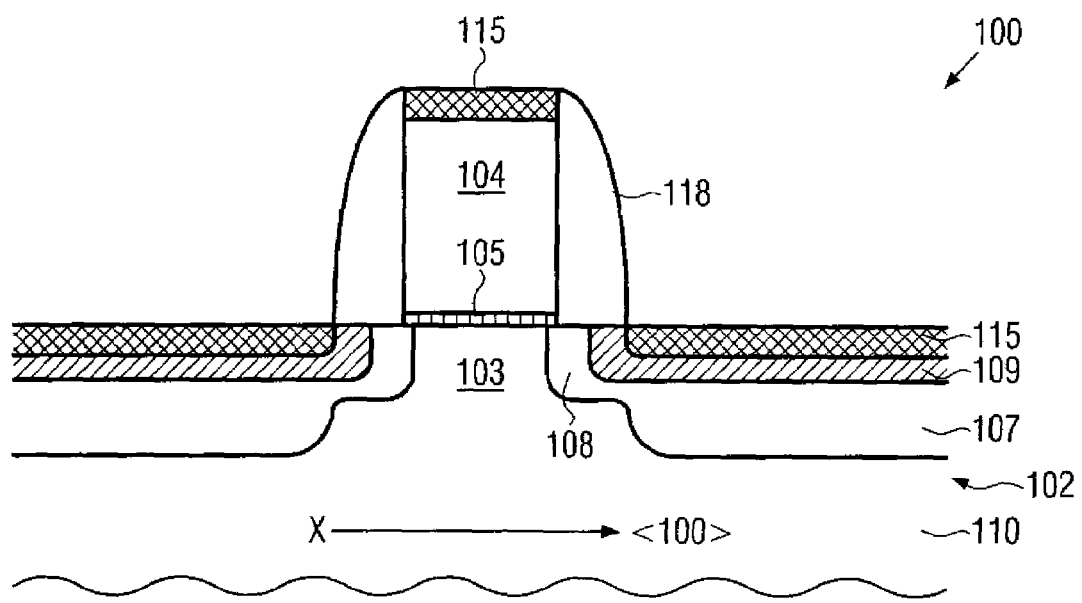

FIG. 1f schematically illustrates the transistor 100 in a further advanced manufacturing stage, in which the metal silicide regions 115 are formed within the regions 109 and the gate electrode 104 on the basis of a further spacer element 118, which may be formed on the liner 117 or after removal of the liner 117 on the basis of any appropriate material. For instance, the spacer 118 may be formed from a material having a reduced dielectric constant, thereby reducing parasitic capacitances. Consequently, the device 100 as shown in FIG. 1f may comprise the strained silicon/carbon material 109 in close proximity to the channel region 103, wherein, as previously explained, the metal silicide regions 115 may not unduly create strain relaxation in the material 109. Moreover, the formation of the material 109 on the basis of ion implantation rather than selective epitaxial growth process provides a high degree of flexibility and compatibility with conventional CMOS techniques, since the formation of the material 109 may be performed in a highly spatially selective manner at a plurality of different points within the entire process sequence. For instance, the process 116 provides a high degree of flexibility in combination with the formation of P-channel transistors on the basis of epitaxially grown silicon/germanium material, since the process 116 may be performed at a final stage of the transistor manufacturing sequence without affecting the performance or the manufacturing flow of the P-channel transistors. Rather, by providing an additional anneal process with reduced diffusion and by providing respective spacers 118 having a reduced relative permittivity, an even further enhancement of transistor performance may be achieved in P-channel devices or other components not receiving the strained silicon/carbon material. With respect to the electron mobility enhancement in the channel region 103, the same criteria apply as previously explained.

Figure 1G:
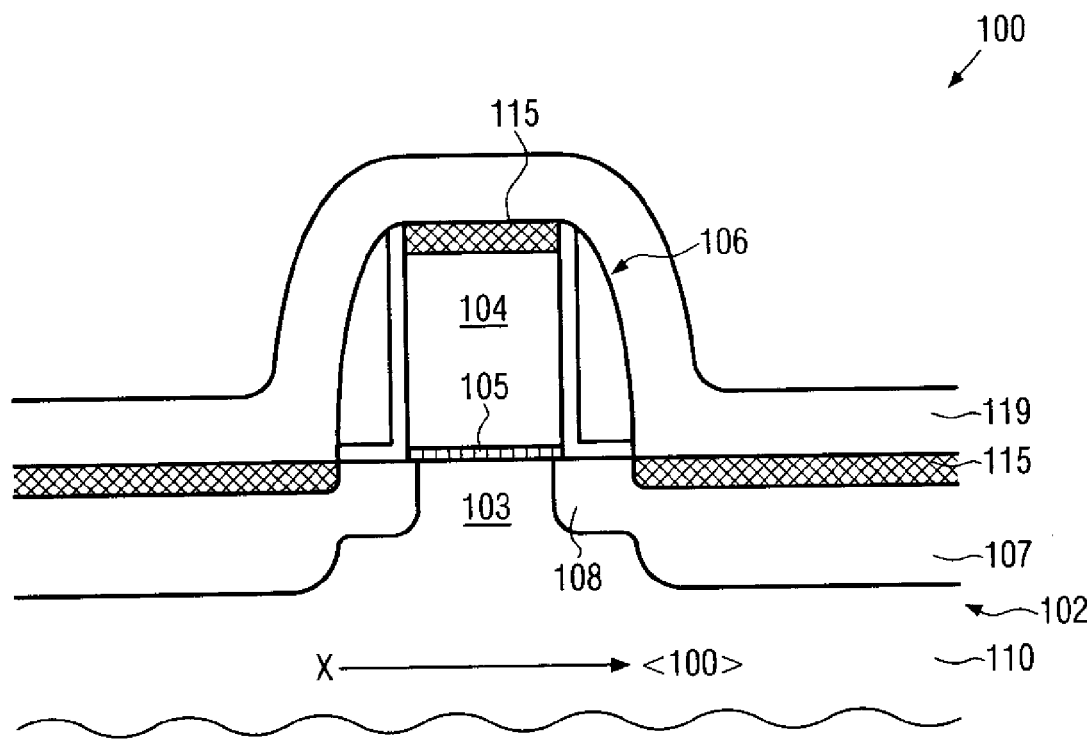

FIG. 1g schematically shows the transistor 100 according to yet other illustrative embodiments. In these embodiments, the transistor 100 may or may not comprise the strained silicon/carbon material 109 and may, additionally or alternatively, have formed thereon a stressed overlayer 119, such as a contact etch stop layer, which may be comprised of silicon nitride having a high intrinsic tensile stress. In the embodiment shown in FIG. 1g, the transistor 100 may not have formed therein the material 109, wherein the layer 119, possibly in combination with the spacers 106, may act as a stress source similarly to the strained material 109. For example, the biaxial stress in the layer 119 may transfer a corresponding stress into the regions 115 and thus into the drain and source regions 107 and may also act via the spacers 106 onto the channel region 103. Consequently, the corresponding stress may also provide a substantially tensile component in the length direction of channel region 103, while causing a corresponding compressive component in the channel width direction, i.e., the Y-direction. Although the corresponding components may be less compared to a more direct action of the strained material 109, by appropriately selecting the orientation of the channel length direction, for instance in the <100> crystallographic orientation for a surface orientation of (100), a significant enhancement may be achieved compared to conventional approaches with stressed overlayers. Thus, a significant electron mobility increase may be obtained without requiring the formation of strained silicon/carbon material. Moreover, in combination with the strained material 109, the stressed overlayer 119 provides an even further enhanced mechanism.

As previously explained, the channel length direction may be selected in accordance with two-dimensional strain calculations, wherein the transistors, such as P-channel transistors and N-channel transistors, may then be orientated so as to obtain the desired electron mobility in the N-channel transistors, as previously described. In other embodiments, only a fraction of the number of respective N-channel transistors may be oriented with respect to the specified crystallographic orientation, while other transistor elements may be positioned differently in order to not significantly decrease or even enhance, however less pronounced, the performance thereof. Thus, the design of the circuit layout under consideration may be appropriately adapted to take into consideration the two-dimensional strain characteristics of respective stress sources, which may induce tensile strain along the channel length direction and compressive strain along the channel width direction.

Figures 2A, 2B:
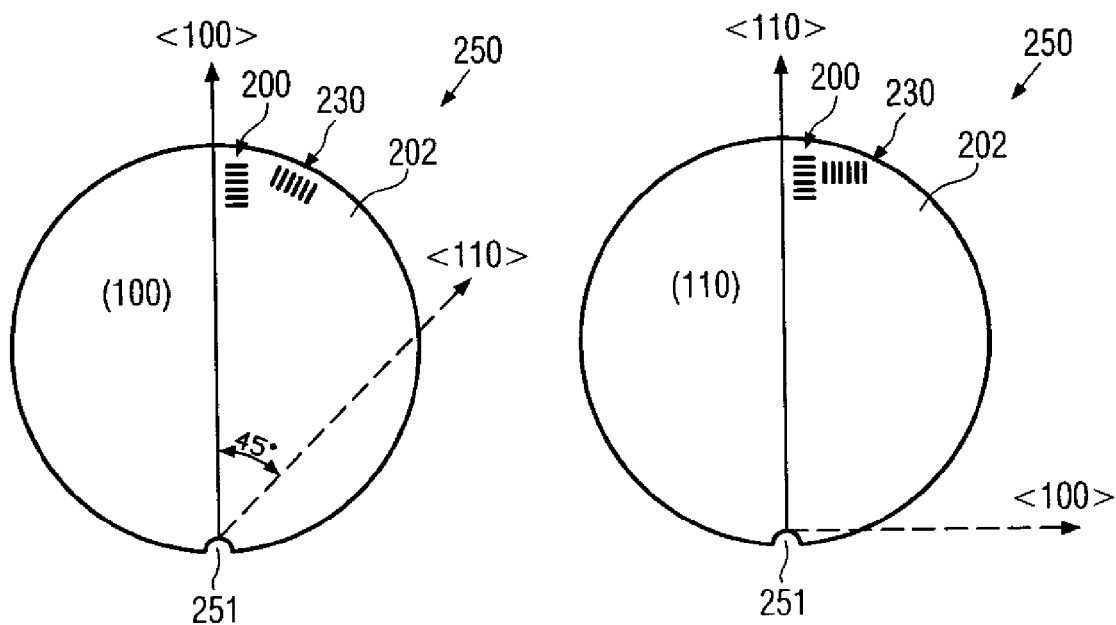
FIGS. 2a-2b schematically illustrate plan views of silicon-based substrates having formed thereon transistor devices, the channel length directions of which are oriented in accordance with illustrative embodiments of the present invention.

FIG. 2a schematically illustrates a substrate 250 having formed thereon a respective silicon-based layer 202, which may have a surface orientation (100). Contrary to conventional techniques, the substrate 250 may be prepared such that a corresponding notch 251 indicates a <100> crystallographic direction instead of a <110> direction, thereby enabling the adaptation of conventional circuit designs and process techniques, in which the corresponding channel regions of transistor elements are automatically oriented along the <100> direction. Consequently, the respective increase of electron mobility in the N-channel transistors may be obtained substantially without modification of an existing circuit layout and manufacturing sequence. In other illustrative embodiments, first transistor elements 200, which may have a configuration similar as is described with reference to FIGS. 1a-1g may be provided with an orientation of the respective channel length directions as indicated in FIG. 2a, while other transistors 230, for instance P-channel transistors, may be oriented with their respective channel length directions in a different crystallographic orientation, for instance along the <110> direction. In this case, a corresponding redesign of the circuit layout and specific processes may have to be performed. It should also be appreciated that the respective orientations of the first and second transistors 200 and 230 are of illustrative nature only, and other respective orientations of the channel length directions, providing increased electron mobility, may be selected on the basis of the two-dimensional strain considerations, as previously explained.

FIG. 2b schematically illustrates the substrate 250 according to a further illustrative embodiment, in which the surface orientation is (110) so that the corresponding crystallographic orientations <110> and <100> have an angular offset of 90 degrees. Consequently, the first and second transistors 200, 230 may be oriented with an angular offset of 90 degrees, which may allow a more efficient circuit layout compared to other angular offsets, such as 45 degrees and the like. For example, when the first transistors 200 represent N-channel transistors including a stress-inducing mechanism as is for instance described with reference to FIGS. 1a-1g, a tensile stress component is substantially oriented along the <110> crystallographic direction, while the respective compressive stress may be oriented along the <100> direction. In this case, a less efficient enhancement of the electron mobility may be achieved for the benefit of a more efficient circuit layout, wherein, however, the overall enhancement of electron mobility is still significantly higher compared to conventional approaches. Similarly, when the transistors 230 may represent N-channel transistors, the corresponding resulting compressive stress along the <110> crystallographic orientation may efficiently contribute to an overall mobility increase, as is for instance illustrated in Equation 2. Consequently, using the substrate 250 having a surface orientation (110) provides high flexibility in selecting an appropriate crystallographic orientation for the channel length direction, wherein other transistor types may also be appropriately oriented in the same direction or in another direction, wherein the angular offset of the direction <110> and <100> may provide respective circuit layouts of reduced complexity. Moreover, in these cases, a high degree of flexibility may be achieved when specific transistor elements are provided with strained silicon/germanium material, for instance in one of the groups 200, 230 in FIGS. 2a-2b, in combination with respective N-channel transistors, as previously described, since a plurality of different orientation combinations are available without undue design complexity.

As a result, the present invention provides an improved technique for the formation of N-channel transistors in order to enhance the electron mobility therein by appropriately selecting the channel length direction with respect to the crystallographic characteristics of the silicon-based semiconductor material. By considering a two-dimensional strain behavior, the respective piezoelectric coefficients may be used in determining an appropriate orientation for the N-channel transistors based on a respective strain-inducing source. In illustrative embodiments, the strain-inducing source may be a strained silicon/carbon material, formed by epitaxial growth techniques, implantation techniques and the like, wherein the channel length direction is oriented to more efficiently increase the combined effect of tensile and compressive strain in the channel region. Thus, contrary to conventional techniques in which channels of N-type transistors are oriented along the <110> crystallographic orientation, a significant increase may be achieved by using the <100> orientation which may account for an electron mobility enhancement of a factor of approximately four or greater comparing to the conventional configuration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   selecting a first orientation of a channel length direction of a channel region with tensile strain for an N-channel transistor to be formed in a silicon-based semiconductor layer having a specified surface orientation on the basis of at least two linearly independent strain components in said channel region, wherein selecting said first orientation comprises determining a crystallographic orientation of said semiconductor layer that provides the maximum electron mobility in the channel length direction and selecting said determined crystallographic orientation as said first orientation;
   forming drain and source regions of said first transistor to define said channel region, said channel length direction substantially oriented along said first orientation; and
   inducing a tensile strain in said channel region along said first channel length direction.

2. The method of claim 1, wherein said first orientation substantially corresponds to a <100< orientation in said semiconductor layer.

3. The method of claim 2, further comprising inducing a compressive strain along a channel width direction.

4. The method of claim 1, wherein said tensile strain is induced by forming a strained silicon/carbon material at least in a portion of said drain and source regions.

5. The method of claim 4, wherein said strained silicon/carbon material is formed by a selective epitaxial growth technique.

6. The method of claim 4, wherein said strained silicon/carbon material is formed by implanting carbon into said semiconductor layer.

7. The method of claim 6, wherein implanting said carbon is performed so as to obtain a local carbon concentration in said semiconductor layer of at least approximately 1.5 atomic percent.

8. The method of claim 6, further comprising substantially amorphizing a portion of said semiconductor layer prior to implanting said carbon and implanting said carbon into said substantially amorphized portion.

9. A method, comprising:
forming a strained silicon/carbon material near a channel region of a transistor, said channel region defining a length direction substantially along a <100< crystallographic orientation of a silicon-based layer.

10. The method of claim 9, wherein forming said strained silicon/carbon material comprises performing a selective epitaxial growth process for growing said silicon/carbon material on a silicon template.

11. The method of claim 9, wherein forming said strained silicon/carbon material comprises implanting carbon into said silicon-based semiconductor layer and activating said carbon.

* * * * *

UNITED STATES PATENT AND TRADEMARK OFFICE
CERTIFICATE OF CORRECTION

PATENT NO.         : 7,767,540 B2
APPLICATION NO.    : 11/567268
DATED              : August 3, 2010
INVENTOR(S)        : Igor Peidous, Thorsten Kammler and Andy Wei It is certified that error appears in the above-identified patent and that said Letters Patent is hereby corrected as shown below:

Col. 14, line 66 (claim 2, line 2), delete "<100<" and insert therefor -- <100> --.

Col. 16, line 6 (claim 9, line 4), delete "<100<" and insert therefor -- <100> --.

Signed and Sealed this

Twenty-eighth Day of September, 2010

David J. Kappos
*Director of the United States Patent and Trademark Office*